United States Patent
Evenou et al.

(10) Patent No.: US 10,750,204 B2
(45) Date of Patent: *Aug. 18, 2020

(54) SYSTEM AND METHOD FOR PROCESSING DATA

(71) Applicant: ROZO SYSTEMS, La Chapelle-sur-Erdre (FR)

(72) Inventors: Pierre Evenou, La Chapelle sur Erdre (FR); Didier Feron, La Chapelle sur Erdre (FR); Sylvain David, Les Landes Genusson (FR); Jean-Pierre Monchanin, Saint Nazaire (FR)

(73) Assignee: ROZO SYSTEMS, La Chapelle-sur-Erdre (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/205,949

(22) Filed: Nov. 30, 2018

(65) Prior Publication Data
US 2019/0191181 A1    Jun. 20, 2019

Related U.S. Application Data

(63) Continuation of application No. 15/126,887, filed on Sep. 16, 2016, now Pat. No. 10,182,243.

(51) Int. Cl.
*H04N 19/60* (2014.01)
*G06F 17/10* (2006.01)
(Continued)

(52) U.S. Cl.
CPC ............. *H04N 19/60* (2014.11); *G06F 17/10* (2013.01); *H03M 13/07* (2013.01);
(Continued)

(58) Field of Classification Search
None
See application file for complete search history.

(56) References Cited

U.S. PATENT DOCUMENTS

| 10,182,243 B2 * | 1/2019 | Evenou | H04N 19/60 |
| 2002/0070944 A1 * | 6/2002 | Deering | G06T 3/0081 |
| | | | 345/581 |

(Continued)

FOREIGN PATENT DOCUMENTS

| WO | 2015/055450 | 4/2015 | |
| WO | WO-2015055450 A1 * | 4/2015 | ........ H03M 13/611 |

OTHER PUBLICATIONS

Vasarhelyi et al., "Analysis of Mojette Transform Implementation on Reconfigurable Hardware", Dagstuhl Seminar Proceedings 06141, 2006, pp. 1-6. (Year: 2006).*

(Continued)

*Primary Examiner* — Reza Aghevli
(74) *Attorney, Agent, or Firm* — Ipsilon USA, LLP

(57) ABSTRACT

A processing system and method are provided for reconstituting a block of pixels from bins generated by a Mojette Transform, using a processing and calculation unit (UTC), a bin memory (MB), and a pixel memory (MP). The unit is configured to carry out the operations of reconstructing the pixels, which are performed by reading the bins in the bin memory, reading the reconstructed pixels in the pixel memory, and writing the reconstructed pixels in the pixel memory, such that the steps of reconstructing the pixels do not include an operation of writing bins in the bin memory.

11 Claims, 6 Drawing Sheets

(51) Int. Cl.
*H04N 19/42* (2014.01)
*H03M 13/07* (2006.01)
*H03M 13/37* (2006.01)
*H04N 19/176* (2014.01)
*H04N 19/182* (2014.01)

(52) U.S. Cl.
CPC ........ *H03M 13/3761* (2013.01); *H04N 19/42* (2014.11); *H04N 19/176* (2014.11); *H04N 19/182* (2014.11)

(56) References Cited

U.S. PATENT DOCUMENTS

| | | | | |
|---|---|---|---|---|
| 2004/0012609 A1* | 1/2004 | Taneja | ............ | G06T 5/20 345/611 |
| 2015/0379663 A1* | 12/2015 | Gruber | ............ | G06T 1/20 345/522 |
| 2016/0254826 A1* | 9/2016 | David | ............ | H04L 1/0043 714/758 |
| 2017/0048551 A1* | 2/2017 | Evenou | ............ | H04N 19/60 |

OTHER PUBLICATIONS

Turan et al., "Mojette Transform Software—Hardware Implementations and its Applications", Infocommunication Journal, vol. III, No. 1, Feb. 2011, pp. 39-47. (Year: 2011).*

Nomand et al., "A Geometry Driven Reconstruction Algorithm for the Mojette Transform", Discrete Geometry for Computer Imagery, Oct. 2006, Szeged, Hungary, Springer Berlin/Heidelberg, 4245, pp. 122-133. (Year: 2006).*

Guedon et al., "The Mojette Transform: The First Ten Years", Discrete Geometry for Computer Imagery, Apr. 2005, Poitiers, France, Springer Berlin/Heidelberg, 3429, pp. 79-91. (Year: 2005).*

* cited by examiner

| | bins | | | | | | | |
|---|---|---|---|---|---|---|---|---|
| | 0 | 1 | 2 | i | | | 127 | 128 |
| proj 0 | 128 | 0 xor 129 | 1 xor 130 | ------ | support[i-1] xor support[128+i] | --- ---- | 126 xor 255 | 127 |
| proj 1 | 0 xor 128 | 1 xor 129 | 2 xor 130 | -------- | support[i] xor support[128+i] | -------- | | 255 |
| proj 2 | 0 | 1 xor 128 | 2 xor 129 | ------ | support[i] xor support[128+i-1] | -------- | 127 xor 254 | 255 |

SYSTEM AND METHOD FOR PROCESSING DATA

RELATED APPLICATIONS

This application is continuation of U.S. patent application Ser. No. 15/126,887, filed on Sep. 16, 2016, which in turn is a National Phase of PCT Application PCT/FR2015/050771 filed on Mar. 26, 2015, which in turn claims the benefit of French Patent Application No. 14 52585, filed on Mar. 26, 2014, the entirety of which are incorporated herein by reference.

FIELD OF THE INVENTION

The present invention generally relates to the computer processing of data.

PRIOR ART

Distributed data storage systems conventionally use bulk replication of the stored data in order to obtain a satisfactory level of reliability.

The use of erasure codes, such as the Mojette transform, allows a similar level of reliability to be ensured while reducing the volume of redundant data required to reconstruct a data block of a file.

However, the known erasure code solutions have the drawback of being consumptive in terms of processor computation time, which restricts them to specific uses such as backup.

Among the erasure code solutions, it is known practice to implement programs that use the Mojette transform to generate, from a data block, projections composed of elements called bins. In this sense, the Mojette transform is usually called the direct Mojette transform. In order to reconstruct the data block, said programs also use the inverse Mojette transform. The principles of the direct Mojette transform and of the inverse Mojette transform are described in particular in the document by Jozsef Vasarhelyi ET AL: "*Analysis of 1-19 Mojette Transform Implementation on Reconfigurable Hardware*", *Dagstuhl Seminar Proceedings* 06141, Schloss Dagstuhl, Oberwolfach, Germany, Feb. 4-Jul. 4, 2006, 2 Apr. 2006 (2006-04-02), XP55161918, Schloss Dagstuhl, Oberwolfach, Germany ISSN: 1862-4405.

However, it has been observed that these programs using the Mojette transform are implemented in such a way that the time required to reconstruct a data block is substantial in comparison to the performance offered by current computer hardware, such that these programs do not allow the performance offered by current hardware systems to be put to best use. By way of example, in the field of storage, the reading/writing speed of SSD or flash memory is not used effectively by these programs. In a similar manner, in the field of networks, bit rates of higher than 10 gigabit/s, provided by certain optical fiber lines, are also not used effectively by such programs.

An aim of the present invention is to propose a new system and a new method for processing data which are less consumptive in terms of computation time and thus allow the performance of computer hardware to be used effectively.

In particular, an aim of the invention is to propose a new system and a new method for processing data making it possible to limit the time required to reconstruct a data block.

SUMMARY OF THE INVENTION

To this end, a subject of the invention is a data processing system configured to reconstruct a block, called a support, formed from basic computer data, called pixels, using other computer data, called bins, said bins being elements of at least two different projections which result from a mathematical transform of Mojette type applied to said pixels, the system also comprises:
  a unit for processing and computing data;
  a first memory area, called the bin memory, in which said generated bins are
  written;
  a second memory area, called the pixel memory, separate from the bin memory and in which the pixels of said block to be reconstructed are intended to be written;
characterized in that said processing and computation unit is configured to receive a request to reconstruct the block of pixels, and to:
a) reconstruct one, or more, pixels, referred to as a direct pixel, whose value is equal to that of a bin, referred to as a direct bin, the computation of said direct bin having involved only said direct pixel;
b) reconstruct each remaining pixel by applying the XOR operator between a bin, whose computation has involved said remaining pixel, and the one or more other reconstructed pixels which are involved, with said remaining pixel, in the computation of said bin;
said unit being configured to carry out the operations to reconstruct the pixels by reading said bins from the bin memory, writing the reconstructed pixels to the pixel memory, and by reading said reconstructed pixels from the pixel memory, so that the steps of reconstructing the pixels are without an operation of writing a bin to the bin memory.

The term "different projections" is understood to mean projections obtained by applying the Mojette transform along two different directions of projection, as explained in more detail below.

Said or each direct pixel is reconstructed by writing, to the pixel memory, the value of the corresponding direct bin. Each remaining pixel, i.e. each pixel that is involved, along with one or more other pixels, in the computation of one or more bins, is reconstructed by writing, to the pixel memory, the result of XOR operations between the corresponding bin and said one or more other corresponding reconstructed pixels.

Thus, the reconstruction of a direct pixel allows another pixel to be reconstructed in the case in which the latter was used along with said direct pixel for computing a given bin. For another bin that has been computed by combining multiple pixels, one of which has yet to be reconstructed, the pixel of this combination that is yet to be reconstructed may then be reconstructed by applying the XOR operator between said bin and said one or more other, already reconstructed, pixels. The computation of the pixels may thus be carried out, step by step, by using one or more pixels that have just been reconstructed in order to compute another pixel that is yet to be reconstructed.

Thus, step by step, the pixels are reconstructed without modifying, or updating, the bin values, such that the reconstruction operations do not give rise to writing to the bin memory.

The reconstruction system known from the prior art, and in particular from the document by Jozsef Vasarhelyi ET AL: "*Analysis of 1-19 Mojette Transform Implementation on Reconfigurable Hardware*", *Dagstuhl Seminar Proceedings* 06141, Schloss Dagstuhl, Oberwolfach, Germany, Feb.

4-Jul. 4, 2006, 2 Apr. 2006 (2006-04-02), XP55161918, Schloss Dagstuhl, Oberwolfach, Germany ISSN: 1862-4405, uses the reconstruction algorithm, called the inverse Mojette transform, according to an implementation in which the reconstructed pixel is subtracted from the value of the associated bin for each projection. The value of the bin is then modified, due to the subtraction, and re-memorized in the bin memory. In the system according to the invention, this operation of updating the value of the bin is not implemented, thereby making it possible not to have to write to the bin memory.

Designing the system according to the invention in such a way allows the memory accesses to be optimized by rewriting each pixel to be reconstructed in the form of a bin, or a combination of a bin and one or more pixels that have already been reconstructed, so that write operations have to be carried out only on the pixel memory and a multiplicity of successive reads/writes of the bins from/to the bin memory does not have to be carried out.

Limiting the number of write accesses to the bin memory in such a way allows the support reconstruction performance to be improved with regard to a processing unit of single- or multi-core type.

Thus, for reconstructing the support pixels, the processor of the unit uses only requests to read the bin memory in which the projections are located and requests to write the reconstructed pixels directly to the pixel memory, without having to request new writes to the bin memory.

The optimization of the memory accesses produced by such a processing system makes the processing system particularly well suited to systems and uses requiring a large bandwidth.

Advantageously, the bin memory and the pixel memory are produced in the form of two physically separate media. In particular, the bin memory may form part of a first device of computer or server type, and the pixel memory may form part of a second device of computer or server type. The processing and computation unit may form part of the first or of the second device, or else of a third, separate device that can be connected to one or the other of the devices via a communication network.

The use of the "exclusive OR" (XOR) mathematical operator makes it possible to limit the quantity of memory required to carry out the operations of reconstructing the pixels of the support.

According to one advantageous feature of the invention, the processing and computation unit comprises a program, called a pixel reconstruction program, allowing steps a) and b) to be carried out, said program having instructions according to which each direct pixel to be reconstructed, denoted by support(kd), is computed by an equation in the form:

$$support(kd)=projection[i].bin[j],$$

and said program having instructions according to which each pixel to be reconstructed, denoted by support(k), other than a direct pixel, is computed by an equation in the form:

$$support(k)=projection[i].bin[j]\hat{\,}support(l)$$

or $$support(k)=projection[i].bin[j]\hat{\,}support(l)\hat{\,}\ldots\hat{\,}support(n)$$

k or kd being the index of the pixel of the support to be reconstructed l, n being indices defining various pixels that have been reconstructed and which have been used to generate the bin projection[i].bin[j];

$\hat{\,}$: the XOR operator projection[i].bin[j]: the value of the bin[j] of the projection projection[i] which has been generated by using the support (kd) or support (k) pixel and, when the bin is not a direct bin, the support[l] or support[l]$\hat{\,}$...$\hat{\,}$ support[n] pixels.

The expression "$\hat{\,}$...$\hat{\,}$ support (n)" corresponds to one or more other pixels combined with the support[l] pixel when the generation of bin[j] has involved the support (k) and support (l) pixels and said one or more other "$\hat{\,}$...$\hat{\,}$ support (n)" pixels.

To clarify that the pixel reconstruction operations do not involve writing to the bin memory during the reconstruction of said pixels of the support, it will be noted that, according to these instructions, the left-hand side of the equation is always a pixel, which means that there is no write operation in the bin memory, but simply a read operation, the write operations being pixel writes carried out in the pixel memory.

The list of pixels of index l, n which, in combination with the pixel of index k, gives the value of the bin of index j of the projection of index i, may be obtained via the inverse Mojette transform reconstruction algorithm known from the prior art. This list allows a lookup table to be formed, as explained below, which may be used for generating one or more reconstruction programs comprising said computer operations of support (kd)=projection[i].bin[j], support (k)=projection[i].bin[j]$\hat{\,}$support(l) or support(k)=projection[i].bin[j]$\hat{\,}$support(l)$\hat{\,}$...$\hat{\,}$ support(n) type, depending on the number of pixels involved in the computation of the associated bin.

The list of pixels may be stored in a memory to be associated with each bin and used at the moment of reconstruction of the pixel k or kd from the bin[j] of the projection [i] or to give rise to the generation of a program carrying out the operations: support (kd)=projection[i].bin[j], support (k)=projection[i].bin[j]$\hat{\,}$support(l) or support[k]=projection [i].bin[j]$\hat{\,}$support(l)$\hat{\,}$...$\hat{\,}$ support(n), depending on the number of pixels involved in the computation of the associated bin.

The remainder of the operations presented above may be obtained by offline execution of the known inverse Mojette transform algorithm for the set of projections in question, denoted by M, out of the G projections generated and preferably arranged in ascending order of their angles (p,q). G and M are natural numbers, where M is smaller than or equal to G.

According to one advantageous feature of the invention, the processing and computation unit comprises another program, called an association program, comprising, for each pixel to be reconstructed, the following instructions:

identifying the or each bin in the computation of which said pixel to be reconstructed is involved;

associating said bin and said pixel in a lookup table;

and said processing and computation unit is configured to generate said pixel reconstruction program according to the lookup table.

In the case of a bin whose generation has involved one or more pixels other than said pixel to be reconstructed, said bin and said pixel to be reconstructed are at the end of the association operations and are associated with said one or more other pixels which are involved in the computation of said bin.

Said bin and said one or more pixels may be associated, for example, by their indices by writing them to one and the same row or same column of the lookup table. In particular, for each pixel to be reconstructed, the index of said pixel may be added to a table that associates the index of said pixel with the index of one or more bins in the computation of which said pixel is involved.

Said lookup table may be composed of multiple tables which are distinguished from one another, for example, by the groups of projections from which the bins associated with pixels are drawn. Thus, the lookup table may comprise multiple tables, each involving M projections out of the G generated, and each table comprises a group of M projections that differs from the group of M projections of another table.

Stated otherwise, it is possible to carry out the association of a direct bin and a direct pixel in a lookup table, and similarly, for each pixel to be reconstructed, other than a direct pixel, that is involved in the generation of a bin with one or more other pixels, it is possible to carry out the mutual association thereof in the lookup table for the pixels and the corresponding bin.

The use of the lookup table for the correspondence between pixels and bins allows each pixel to be directly computed from the value of an associated bin and, if necessary, from the one or more pixels that have already been reconstructed (starting with the one or more direct pixels) and which have been used for computing the bin and whose indices (or identification information) are memorized in the lookup table.

Advantageously, the lookup table is generated in the following manner. The system simulates the application of the inverse Mojette transform to the bins of at least M projections by replacing the step of subtracting a pixel from a bin with the association, in a lookup table, of the index of said pixel with the index of the bin or of each bin in the computation of which the pixel is involved. Said inverse Mojette transform may be applied according to the algorithm described in paragraph 3.1 entitled "The case where qi=1 for i∈$Z_Q$" in the document "*A geometry driven reconstruction algorithm for the Mojette transform*", by Nicolas Normand, Andrew Kingston, Pierre Evenou, IRCCyN/IVC UMR CNRS 6597 published in "*Discrete Geometry for Computer Imagery, Szeged: Hungary* (2006)" which is entirely incorporated in the description by reference. The steps of this algorithm that are replaced by the operation of association in a lookup table are steps 18 to 27. In particular, the implementation of said inverse Mojette transform is modified in order to replace the subtraction operation usually used with the operation of adding the index of said pixel to the table that associates said index of the pixel with the index of one or more bins in the computation of which said pixel is involved.

Thus, the system according to the invention allows, prior to the reception of a reconstruction request, a reconstruction program or code to be generated, which program or code allows, when it is executed subsequent to the reception of a request, each support to be reconstructed without going through steps of intermediately writing bins to the bin memory.

According to one advantageous feature of the invention, an integer that is greater than or equal to two, denoted by G, of groups of bins, called projections, having been generated from the pixels of said block such that said support may be reconstructed using a minimum given number, denoted by M, of projections, M being smaller than or equal to G, the unit is configured to allow the G projections to be generated in the following manner:

i)—arranging the block of pixels into a rectangle of dimensions {P,Q}, P being the number of columns and Q being the number of rows; then ii)—defining a Cartesian frame of reference (p, q) whose origin is attached to a pixel preferably forming one corner of the rectangle;

iii)—defining G directions, referred to as directions of projection, in the frame of reference (p, q);

iv)—for each of said G directions of projection, the corresponding bin is computed for each pixel of a row or of a column of the block by combining, via application of the XOR operator, said pixel with the other pixels of the block that are encountered in following said direction of projection or by being equal to said pixel when no other pixel is encountered in following said direction of projection.

Stated otherwise, for each line of projection applied to the support, the XOR operator is applied to the pixels of the block that are encountered along the direction of projection.

Advantageously, regarding the frame of reference (p, q), the vector p corresponds to the axis of the rows and the vector q to that of the columns.

The number G of projections that is generated corresponds to the sum of the minimum number M of projections required to reconstruct the generated support and of the number, denoted by R, corresponding to the desired level of redundancy.

The minimum number M of projections and the number G of projections to be generated are defined by the user at the moment of application of the transform to the support pixels.

According to one advantageous feature of the invention, as said system is also configured to generate bins by applying a mathematical transform of Mojette type to a block of pixels, the processing and computation unit is configured to generate a program, called a bin generation program, allowing said bins to be generated, said program comprising, for each bin to be generated, the following instructions:

reading, from the pixel memory, the pixel or pixels to be combined together in order to generate said bin;

generating said bin by applying the XOR operator to the values of said pixels or generating said bin with a value that is equal to the pixel in the case in which the generation of the bin solely involves said pixel;

writing the result of the preceding operation to the bin memory, and the program is exempt from instructions to reset the bin value to be generated, and/or from a step of intermediately reading the bin to be generated and/or from a step of XOR combination of a bin to be generated and said pixels.

The term "intermediately reading a bin" is understood to mean reading a bin for obtaining the bin computed by combining pixels along the direction of projection.

By virtue of the system according to the invention being designed in such a way, it is no longer necessary to carry out as large a number of successive reads and writes as with the solution known from the prior art in order to generate a bin.

According to one advantageous feature of the invention, the processing and computation unit comprises another program, called a bin generation simulation program, including instructions to reset the bin values to be generated and/or to intermediately read the bin to be generated and/or to XOR combine a bin to be generated and said pixels, the unit being configured to generate said bin generation program by identifying the one or more pixels used by said bin generation simulation program in order to generate the corresponding bins and by defining instructions to XOR combine pixels that are exempt from said instructions to reset the bin values to be generated, and/or from a step of intermediately reading the bin to be generated and/or from a step of XOR combination of the bin to be generated and said pixels.

Stated otherwise, said bin generation simulation program, which corresponds to the program known from the prior art, i.e. to the known implementation of the Mojette transform, for generating a bin is preferably run "offline", i.e. without writing to the pixel memory or the bin memory and before receiving a bin generation request, in order to generate a bin generation program, which consumes little memory access and is intended to be executed "online", i.e. in conjunction with the pixel memory and the bin memory and subsequent to the reception of a bin generation request.

Stated otherwise, the offline pre-execution, or simulation, of the direct and inverse Mojette transforms known from the prior art allows the system according to the invention to generate new programs that are intended to be executed online, which take account of the memory accesses required for the respective transforms.

The invention also relates to a processing method and a corresponding computer program product.

To this end, the invention proposes a data processing method, said method allowing a block, called a support, to be reconstructed in a memory area, called the pixel memory, which block is formed from basic computer data, called pixels, using other computer data, called bins, said bins being elements of at least two different projections which result from a mathematical transform of Mojette type applied to said pixels and which are memorized in a memory area, called the bin memory, separate from the pixel memory,
characterized in that said method comprises the following steps:
  receiving a request to reconstruct the block of pixels;
  reconstructing one, or more, pixels of the support, referred to as a direct pixel, whose value is equal to that of a bin, referred to as a direct bin, the computation of said direct bin having involved only said direct pixel;
  reconstructing each remaining pixel by applying the XOR operator between a bin, whose computation has involved said remaining pixel, and the one or more other reconstructed pixels which are involved, with said remaining pixel, in the computation of said bin;
the operations to reconstruct the pixels being carried out by reading said bins from the bin memory, reading said reconstructed pixels from the pixel memory, and by writing the reconstructed pixels to the pixel memory, so that the steps of reconstructing the pixels are without an operation of writing a bin to the bin memory.

According to one advantageous feature of the invention, each direct pixel to be reconstructed, denoted by support (kd), is computed by an equation in the form:

$$\text{support}(kd) = \text{projection}[i].\text{bin}[j],$$

and each pixel to be reconstructed, denoted by support(k), other than a direct pixel, is computed by an equation in the form:

$$\text{support}(k) = \text{projection}[i].\text{bin}[j] \char`\^ \text{support}(l)$$

or $$\text{support}(k) = \text{projection}[i].\text{bin}[j] \char`\^ \text{support}(l) \char`\^ \ldots \char`\^ \text{support}(n)$$

k or kd being the index of the pixel of the support to be reconstructed l, n being indices defining various pixels of the support that have already been reconstructed;
^: the XOR operator
projection[i].bin[j]: the value of the bin[j] of the projection projection[i] which has been generated by using the support (k or kd) pixel and, when the bin is not a direct bin, the support(l) or support(l)^. . . ^ support (n) pixels.

According to one advantageous feature of the invention, prior to the reception of the reconstruction request, the method comprises the following steps, for each pixel to be reconstructed:
  identifying the or each bin in the computation of which said pixel to be reconstructed is involved;
  associating said bin and said pixel in a lookup table;
  generating said pixel reconstruction equations according to the lookup table.

According to one advantageous feature of the invention, in order to generate a bin, the method comprises the following:
  reading, from the pixel memory, the pixel or pixels to be combined together in order to generate said bin;
  generating said bin by applying the XOR operator to the values of said pixels or generating said bin with a value that is equal to the pixel in the case in which the generation of the bin involves a single pixel;
  writing the result of the preceding operation to the bin memory, and the method for generating said bin is exempt from instructions to reset the value of said bin to be generated, and/or from a step of intermediately reading the bin to be generated and/or from a step of XOR combination of a bin to be generated and said pixels.

According to one advantageous feature of the invention, prior to the generation of bins, a bin generation is simulated which includes instructions to reset the bin values to be generated and/or to intermediately read the bin to be generated and/or to combine a bin to be generated and said pixels,
and a bin generation program is generated after having simulated the generation of bins, said bin generation program being generated by identifying the one or more pixels used in the bin generation simulation in order to generate the corresponding bins and by defining instructions to combine pixels that are exempt from said instructions to reset the bin values to be generated, and/or from a step of intermediately reading the bin to be generated and/or from a step of combining the bin to be generated and said pixels.

The invention also relates to a computer program product that can be downloaded from a communication network and/or stored on a medium that can be read by computer and/or can be executed by a processor of a processing and computation unit, characterized in that it comprises program code instructions for implementing the steps of a method such as described above when said program is executed by said processor of the unit.

BRIEF DESCRIPTION OF THE DRAWINGS

The invention will be better understood on reading the following description of embodiments, with reference to the appended drawings in which:

FIG. 5 illustrates the reconstruction path for each of the possible combinations of projections, where the obtained projections are named projection 0, projection 1 and projection 2, in accordance with FIG. 2;

FIG. 6 illustrates the order, corresponding to the arrows, in which the bins of the combination of projections, projection 0 and projection 1, are traversed in order to reconstruct two pixels;

DETAILED DESCRIPTION

Figure 1:
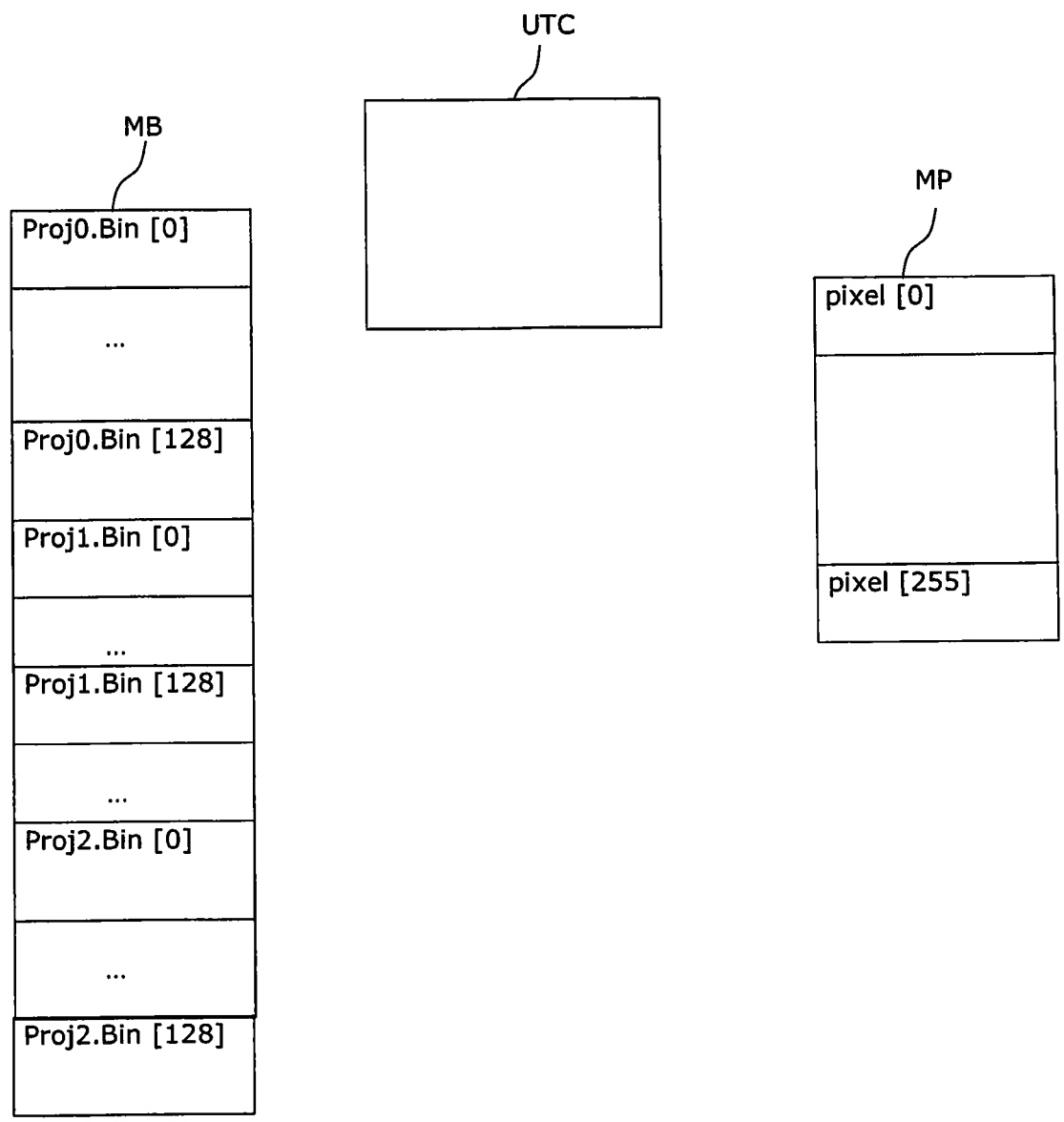
FIG. 1 is a view of a setup according to the invention that comprises a pixel memory, a bin memory and a processing and computation unit.

In the example detailed below and illustrated in the figures, a mathematical transform of exact discrete Radon type is applied to a block of computer data. The Radon projection theorem establishes the possibility of reconstructing a real function with two variables (like an image) using the totality of its projections along concurrent straight lines. In a general manner, for further information on the discrete Radon transform and its properties, the reader may find it useful to refer to the article "IEEE TRANSACTIONS ON ACOUSTICS, SPEECH, AND SIGNAL PROCESSING, VOL. ASSP-35, NO. 2, FEBRUARY 1987 Discrete Radon Transform GREGORY BEYLKIN".

More specifically, the transform used is a transform of Mojette type, modified with respect to that known from the prior art. The basic computer data of said block are called pixels. Stated otherwise, the pixels form the basic information of the block.

The Mojette transform may advantageously be used as an erasure code. Erasure codes are applicable to burst errors.

An erasure code, specified by a quadruplet, (M,G,b,r), is a function E that associates the messages L=(L1, . . . ,LM) of K packets of size b with a coding of E(L)=(E1(L), . . . , EG(L) type of G packets of size b, such that regardless of the series of r packets indexed ij, Ei1(L), . . . ,Eir(L) for E(L) determines, in a unique manner, the message L. The code is referred to as a maximum distance separable (MDS) code if, and only if, r=M. This definition coincides with that given in the document "F. J. MacWilliams and N. J. A. Sloane. *The Theory of Error-Correcting Codes*. North Holland, 1983", to which those skilled in the art may refer for more information on erasure codes and which is entirely incorporated in the description by reference.

For a Mojette transform used as an erasure code, the projections resulting from the Mojette transform are the code words. The redundant projections make it possible to compensate for those that are lost.

An erasure code based on the Mojette transform, specified by the triplet (M,G,B(i)), is a function $proj_{pi,qi}$ that transforms an image f formed from M rows into a series of G projections projp1,q1, . . . , projpG,qG of size B(i), such that M projections out of G allow the image f to be reconstructed in a unique manner. The various projections obtained play an equivalent role when it comes to reconstruction. The loss of one projection is compensated for by another projection, regardless of its angle, as long as the number of projections does not exceed G-M lost projections.

The block is called a support. The mathematical transform applied to the pixels generates multiple groups of computer data, called bins. Said groups are called projections.

The bins of a first projection are distinguished from the bins of a second projection by the direction of projection used for generating the corresponding bins. A projection is thus a set (or group) of bins to which a given direction of projection corresponds. A projection is defined by a size in terms of bins, and an angle (p; q) defining a direction of projection, as detailed below.

The direct Mojette transform thus corresponds to a set of discrete projections resulting from a combination, using the XOR (exclusive or) operator, of support pixels.

The value of each bin corresponds to the sum of the pixel values taken along a line of projection. A line of projection corresponds to a direction of projection applied to a pixel of the support.

The implementation of the transform according to the invention, applied to the reconstruction of a support from the bins of multiple projections or to the generation of bins, in particular of multiple projections, from the support pixels, is based on the implementation of the Mojette transform known from the prior art, which is detailed below. Stated otherwise, the setup and the method according to the invention reuse the principle of projections from the Mojette transform and its properties, but with an implementation that is modified with respect to that known from the prior art and which relates to memory accesses.

In a general manner, for further information on the Mojette transform and its properties, the reader may find it useful to refer to the article "Internet distributed image information system" by J. P. Guédon, B. Parrein and N. Normand, published in "Integrated Computer—Aided Engineering", 8 (2001), pages 205-214, ISSN 1069-2509, IOS Press, which is entirely incorporated in the description by reference.

The following designations will be used hereinafter:
  standard direct Mojette transform: the direct Mojette transform implemented in a manner known from the prior art, applied to a block of pixels in order to break them down into bins;
  direct Mojette transform according to the invention: the direct Mojette transform implemented according to the invention, corresponding to a modification of the implementation of the standard Mojette transform, applied to a block of pixels in order to break them down into bins;
  standard inverse Mojette transform: the inverse Mojette transform implemented in a manner known from the prior art, applied to the bins in order to reconstruct the block of pixels;
  inverse Mojette transform according to the invention: the inverse Mojette transform implemented according to the invention, corresponding to a modification of the implementation of the standard inverse Mojette transform, applied to the bins in order to reconstruct the block of pixels.

More particularly regarding the implementation of the standard inverse Mojette transform, the reader may find it useful to refer to the article "*A geometry driven reconstruction algorithm for the Mojette transform*", by Nicolas Normand, Andrew Kingston, Pierre Evenou, IRCCyN/IVC UMR CNRS 6597 published in "*Discrete Geometry for Computer Imagery*, Szeged: Hungary (2006)" which is entirely incorporated in the description by reference. The reader may also find it useful to refer to annexes A and B of the thesis by B. Parrein "*Description multiple de l'information par transformation Mojette [Multiple description of information by Mojette transorm]*, Benoit Parrein, doctoral thesis, University of Nantes, November 2001" which may be found at the address: http://www.irccyn.ec-nantes.fr/~parrein/pubs.htm and which is entirely incorporated in the description by reference.

More particularly regarding the implementation of the standard direct Mojette transform, the reader may find it useful to refer to chapter 3 section 3.2.1 of the aforementioned thesis by B. Parrein.

The block of pixels is present in the form of a line of pixels that, for the processing thereof, may be considered to be a rectangle of dimensions {P, Q}. P is the number of columns and Q the number of rows. Advantageously, the number of rows Q corresponds to the minimum number M of projections required to reconstruct the block of pixels.

A Cartesian frame of reference (p,q) is associated with this rectangle. The origin of this frame of reference is attached to a pixel of the rectangle, preferably a pixel located in one corner of the rectangle. The vector p of this frame of reference corresponds to the axis of the rows. The vector q corresponds to the axis of the columns.

Directions of projection are defined by composition of the two integers (p, q). By way of example, the direction of projection p=0 and q=1 corresponds to a projection along the direction of the columns.

A projection operation consists, for a direction of projection defined by a pair of values p, q, of scanning a row or a column and, for each pixel of the scanned row or column, of combining, via application of the XOR operator, said pixel with the other pixels encountered along this direction of projection.

In practice, a displacement within the block of pixels along the direction of projection corresponds to a displacement within the line of pixels with a given jump value, called the offset.

As recalled above, the mutual combination of two elements, e.g. two pixels, consists of applying the "exclusive or" mathematical operator, i.e. the XOR operator.

A required minimum number, denoted by M, of directions of projection desired for the reconstruction and a level R of desired redundancy are preferably initially defined by the user when the projection generation method is launched using the system as described below.

A metadata file is associated with the generated projections for, during reconstruction, being able to determine the numbers M and R used and, potentially, the size of the block. The desired level of redundancy corresponds to the number of additional projections that it is desired to generate as well as the number of projections (greater than or equal to 2) that is defined as being required to reconstruct the block of pixels.

For a desired level of redundancy that is equal to R, the minimum number of projections to be applied to the block of pixels in order to be able to reconstruct it with said desired level of redundancy is equal to M+R. Thus, the standard direct Mojette transform generates M+R projections.

The generation of a bin, denoted, in this instance, by "proj(k)", of a projection, is written, in the general case and for a projection of angles (p,q), with an equation of the type:

$$\text{proj}(k) = \text{support}(i,j) \text{ xor support}(l,r) \ldots$$

where k is an integer, proj(k) is the $k^{th}$ bin of said projection and support (i,j) and support (l,r) are pixels of the support, j and l,r are indices defining the position of the pixel in the rectangle of pixels of dimensions {P, Q}. The " . . . " correspond to one or more other pixels that are potentially used by the projection, i.e. to one or more other pixels encountered along the direction of projection used.

The terms support (i,j) and support (l,r) may also be written as pixel[x] and pixel[y], where x and y correspond to the rank of these pixels that are located on the straight line of projection associated with the $k^{th}$ bin. Likewise, if the projection is denoted by projection0, proj (k) may be written as projection0.bin[k].

In particular, the algorithm of the standard direct Mojette transform may be written in the form:

start
    For each row from 1 to Q do
    For each column from 1 to P do
    k<-p.row-q.column
    proj(k) xor<-support(row,column)
    endFor
    endFor
End As recalled above, a projection "proj" thus corresponds to a set of bins "(proj(k)". In particular, said projection "proj" is defined by a size in terms of bins, an angle (p; q). The number of pixels to be taken into account for generating a bin depends on the angle (p; q) associated with the projection.

However, as detailed in the example below, in order to generate a bin projection such as proj(k), the implementation of the standard direct Mojette transform, i.e. that known from the prior art, provides for all of the bins of a projection to be preset to 0 before carrying out the generation of a projection by applying the direct Mojette transform.

In the example detailed below, the standard direct Mojette transform is applied to a support of 256 pixels.

In this example, the case in which M=2 and R=1 is considered. Three projections are thus generated. The pixel support is distributed over two rows (M=2), each of 128 pixels. Thus a rectangle {P,Q} of 128 columns and 2 rows is obtained.

Figures 2, 2A:
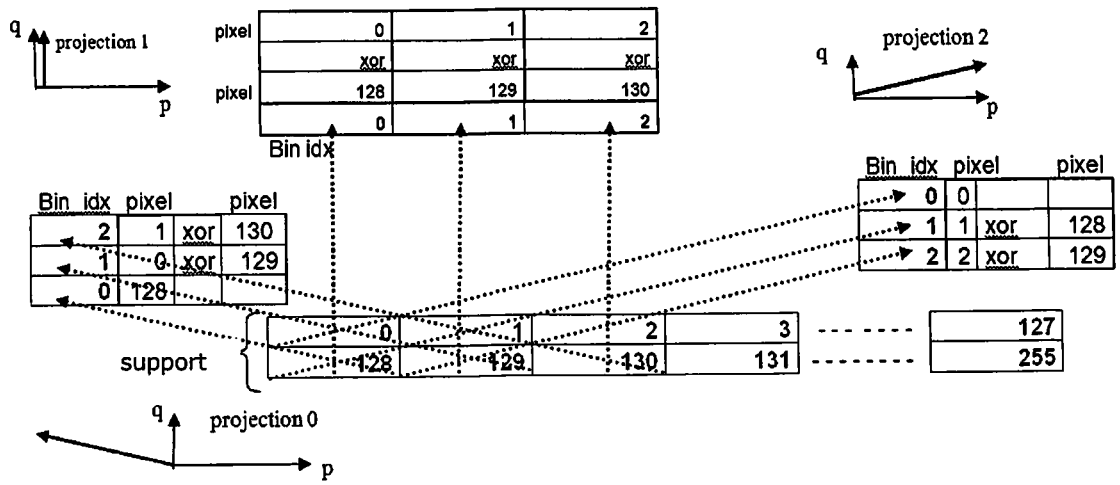
FIG. 2 is a view illustrating the generation of bins from the pixels of a support along multiple directions of projection, denoted by projection 0, projection 1, projection 2, the index of the obtained bins being denoted by bin_idx.
FIG. 2A is a table indicating the composition of each projection bin generated as illustrated in FIG. 2.

The angles (p; q) that are associated, respectively, with the projections to be generated are the following:
    projection0: p=−1; q=1;
    projection1: p=0; q=1;
    projection2: p=1; q=1;

FIG. 2 illustrates the application of the direct Mojette transform to a rectangle of pixels (2, 128) and the representation of the three resulting projections, along with the associated bin values.

The table of FIG. 2A details the content of each of the projections generated in FIG. 2 by standard direct Mojette transform on the support of 256 pixels.

As illustrated in FIG. 1, the standard direct Mojette transform, as with the direct Mojette transform according to the invention detailed below, may be implemented using an installation that comprises:

a first memory, called the pixel memory MP: this memory MP contains the support pixels to which the direct Mojette transform operation must be applied;

a processing and computation unit UTC: the unit comprises a processor, that carries out the read/write operations on the pixel MP and bin MB memories, as well as operations of applying the XOR mathematical operator to the pixels. As detailed below, the processor may also apply this operator to a combination of bin(s) and pixel(s);

a second memory, called the bin memory MB: this memory area is used for storing the results (bins) of the direct Mojette transform.

The processing and computation unit UTC comprises one or more working memories associated with the processor. The unit may be produced in the form of a computer.

The memories and the unit of the computer setup described above may also be used for carrying out the direct Mojette transform according to the invention, the standard inverse Mojette transform and the inverse Mojette transform according to the invention.

The content of the bin memory may be extracted by another entity. This entity may store said bins, e.g. on a disk that is separate from the bin memory, or disseminate them over a network, e.g. in the form of UDP/IP frames.

Standard Direct Mojette Transform

Steps of carrying out the standard direct Mojette transform are detailed below in the context of the computation and writing of a bin corresponding to the index 0, namely the bin[0], of the bins of the projection1 that is illustrated in FIG. 2.

Figure 3:
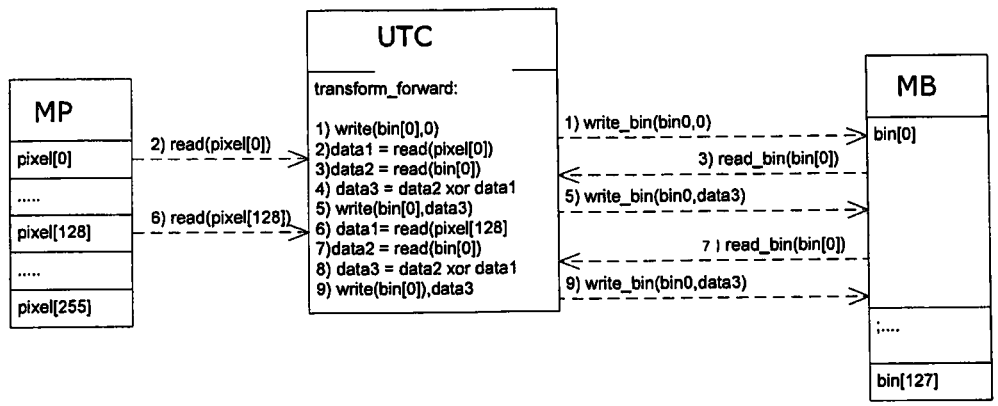
FIG. 3 illustrates the various exchanges that are composed of operations of reading and writing data between the unit and the memories in order to compute a bin, denoted by bin[0], according to the direct Mojette transform known from the prior art.

Thus, in conjunction with FIG. 3, which illustrates the various exchanges between the processor and the memories MB, MP for computing bin[0] of the projection 1 (or, more specifically, projection1.bin[0]), said computation of the bin[0] according to the implementation of the standard direct Mojette transform comprises the following steps:
1) resetting the bin[0] to be generated;
2) reading the pixel[0] from the pixel memory;
3) reading the bin[0] of the projection1;
4) XORing the current content of the bin[0] and the value of the pixel[0];
5) writing the intermediate result of the preceding operation to the bin memory at the location corresponding to bin[0];
6) reading the pixel[128] from the pixel memory;
7) rereading the bin[0] of the projection1 from the bin memory;
8) XORing the current content of the bin[0] of the projection1 and the value of the pixel[128];
9) writing the end result of the preceding operation to the bin memory at the location corresponding to bin[0].

It is thus observed that implementing the Mojette transform in such a way has required a substantial number of operations to be carried out and, in particular, the value of bin[0] to be reset and an intermediate value of bin[0] to be written.

In the context of the chosen example, in order to achieve the complete transformation of the support, this set of operations is repeated 128 times.

Regarding the generation of the two other projections, namely the projections "projection0" and "projection2", the process is carried out in a similar manner by combining, using the XOR operator, the pixels encountered along the direction of projection applied for the "projection0" or the "projection2". The choice of pixels to be combined depends on the angle associated with the projection (see FIG. 2).

Direct Mojette Transform According to the Invention

The implementation of the direct Mojette transform according to the invention allows the successive read/write steps in the generation of a bin of a projection to be excluded, and the reset of the content of a projection to be omitted.

Figure 4:
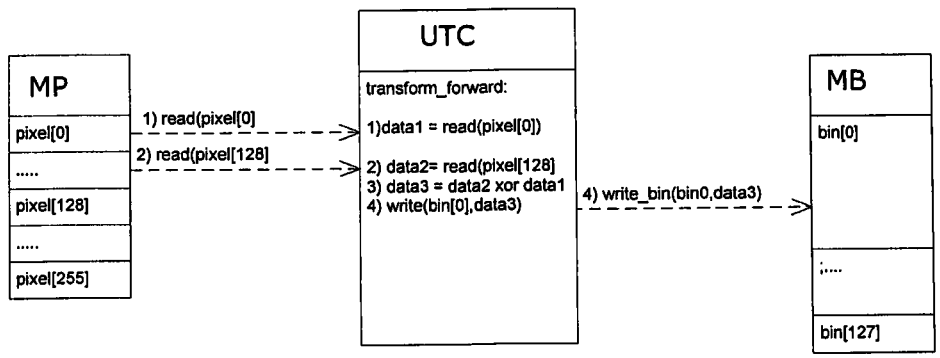
FIG. 4 details steps of executing the direct Mojette transform according to the invention for the bin[0] computation.

Steps of carrying out the implementation of the direct Mojette transform according to the invention are detailed below, in conjunction with FIG. 4, in the context of the computation and writing of a bin corresponding to the index 0 (bin[0]) of the bins of the projection1. Thus, the computation of the bin[0] (or, more specifically, of projection1.bin[0]) by applying the direct Mojette transform according to the invention comprises the following steps:
1) reading the pixel[0] from the pixel memory;
2) reading the pixel[128] from the pixel memory;
3) XORing the current content of the bin[0] and the value of the pixel[128];
4) writing the result of the preceding operation to the pixel memory In order to implement the direct Mojette transform according to the invention that allows the intermediate read/write operations to be avoided, the execution unit comprises a code generator.

The code generator is configured to carry out the following operations:
1) carrying out the algorithm of the standard direct Mojette transform in order to determine, for each bin of a projection, the required combinations of pixels of said bin;
2) producing instructions required to generate a bin in the form: proj(k)=support(i,j) xor support(l,p) . . . .
where support(i,j), support(l,p) . . . are the pixels involved in the generation of the bin proj(k). Step 2) is carried out without a step of resetting the bin value (i.e. proj(k)). The result of XOR combination of pixels is written to the bin memory without intermediate writing to the bin memory.

The code generator may generate as many programs corresponding to the direct Mojette transform according to the invention as there are combinations of configured user block sizes and (M,R) pairs.

When the processing and computation unit receives a request telling it to break the block of pixels down into bins, the unit executes the corresponding program generated by the code generator in order to apply the direct Mojette transform according to the invention to the block of pixels.

After executing said program, a set of 386 bins is obtained, corresponding to the bins of projections "projection 0", "projection1" and "projection 2" as illustrated in FIG. 3A. The set of bins thus obtained is the same as with the standard direct Mojette transform, but much more quickly, since the number of operations required to generate these bins with the one or more programs produced by the code generator is smaller.

In order to reconstruct the support, the unit carries out an inverse Mojette transform, detailed below.

Standard Inverse Mojette Transform

The implementation of the standard inverse Mojette transform, i.e. the implementation of the inverse Mojette transform known from the prior art, is described below, to subsequently show the modifications made to this implementation of the inverse Mojette transform in order to obtain the implementation of the inverse Mojette transform according to the invention.

The starting point is a direct correspondence between a pixel of the support and a bin of a projection. The term "direct correspondence between a pixel and a bin" is understood to mean that the bin was generated using a single pixel. The value of the bin is then that of the pixel.

The corresponding pixel, called a direct pixel, is reconstructed by writing the value of the corresponding direct bin to the pixel memory at the location corresponding to said direct pixel.

In the implementation known from the prior art, the processor then goes through all of the projections associated with the support in order to subtract the value of this reconstructed pixel from each bin generated using said pixel and rewrite the new value of said bin to the bin memory. This process is repeated for all of the pixels of the support.

In order to illustrate the reconstruction process, the previously described example is reused, so that the support to be reconstructed is the support of 256 pixels from which 3 projections have been generated.

Thus, the bin memory MB contains the bins of the three previously generated projections and the processing and computation unit UTC is used for reconstructing said support.

The metadata file associated with the generated projections makes it possible to determine whether two projections out of the three generated is sufficient to reconstruct the support (recall that M=2 and R=1)

Figures 5, 6:
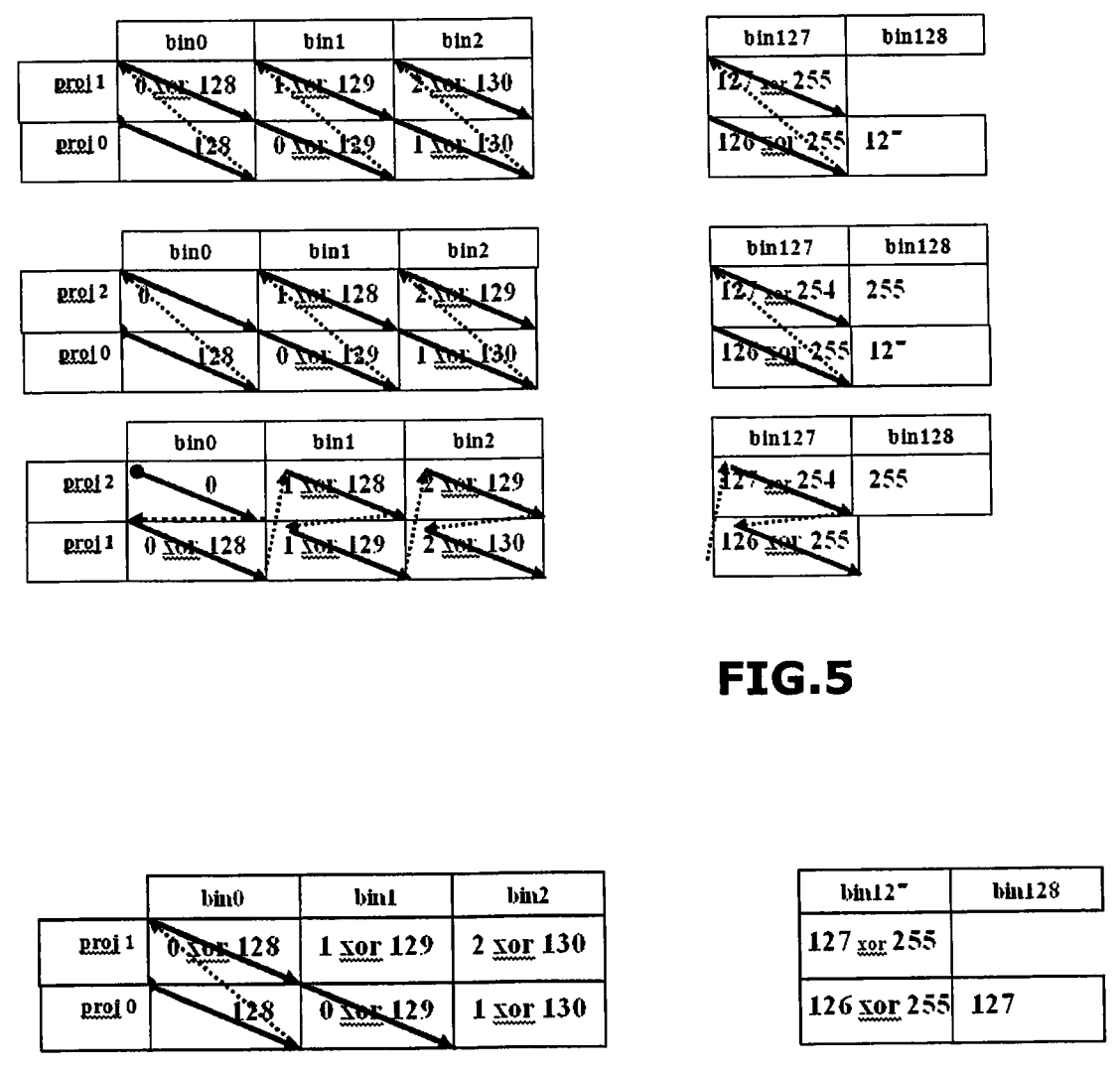

FIG. 5 illustrates the reconstruction path for each of the possible combinations of projections.
combination of projections {projection 1, projection 0): projection0.bin[0] contains the pixel of index 128;
combination of projections {projection 2, projection 0): projection0.bin[0] contains the pixel of index 128 and projection1.bin[0] contains the pixel of index 0.
combination of projections {projection 2, projection 1): projection2.bin[0] contains the pixel of index 0

In order to start reconstruction, the processing and computation unit starts with a direct bin, i.e. a bin for which there is a direct correspondence between the bin and a pixel of the support.

An exemplary reconstruction of the initial support from projection1 and projection0 is presented below.

As indicated in FIG. 5, the starting point is the bin of index 0 of the projection 0 (projection0.bin[0]) which contains the pixel of index 128.

The pixel of index 0 is obtained via an XOR operation between the pixel of index 128 and the bin of index 0 of the projection 1 (projection1.bin[0]):

pixel[0]=pixel[128] XOR projection1.bin[0].

This process is iteratively repeated until reaching the bin of index 127. The operations carried out in order to reconstruct the pixels of the support from the bin of index i are:

pixel[i+128]=pixel[i−1] xor proj0.bin[i]

pixel[i]=pixel[i+128] xor proj1.bin[i]

As in the case of the direct Mojette transform described above, the implementation of the standard inverse Mojette transform is carried out using a bin memory, a pixel memory and a unit of a setup as presented above.

In order to start the operation of reconstructing the pixels of the support, the bin memory MB is loaded beforehand with the required number of projections for carrying out a reconstruction. In the example used in the document (M=2, R=1), this bin memory is loaded with 2 projections, i.e. with 257 bins.

The source of these projections may be, for example, a magnetic medium, a disk or a frame of an IP network.

In the case of the implementation of the standard inverse Mojette transform, the unit is configured as detailed below in order to carry out the operations required to reconstruct the pixels of the support from the projections by carrying out reads/writes on the pixel and bin memories.

Figure 7:
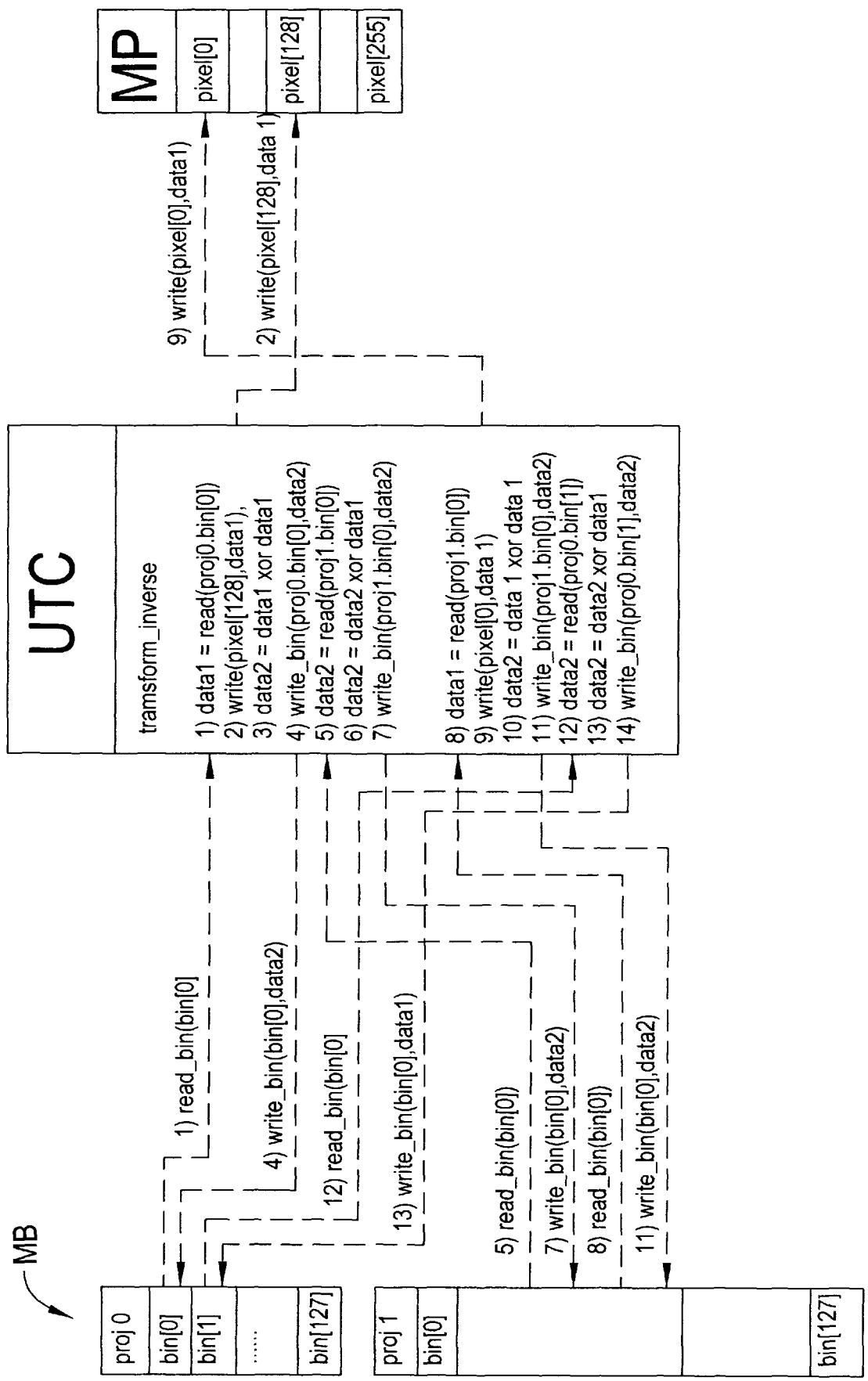
FIG. 7 illustrates the exchanges between the unit and the memories in order to reconstruct two pixels (pixel[0] and pixel[128]) of the support from the projection1 bins and the projection0 bins according to the inverse Mojette transform known from the prior art.

FIG. 7 illustrates the exchanges between the unit and the memories in order to reconstruct two pixels (pixel[0] and pixel[128]) of the support from the projection1 bins and the projection0 bins. FIG. 6 illustrates the order, corresponding to the arrows, in which the bins are traversed in order to reconstruct the two pixels.

In conjunction with FIG. 7, the detail of the operations carried out via the standard implementation in order to reconstruct the pixels pixel[0] and pixel[128] is as follows:
1) reading the content of the bin[0] of the projection0 that contains the pixel[128] (data1);
2) writing the pixel[128] to the support memory with the read value of bin[0];
3) resetting the value of the bin bin[0] that was just read (XOR operation on itself);
4) writing the reset result to the bin memory in the cell corresponding to bin[0] (bin of index 0 of the projection0);
5) reading the bin[0] of the projection 1 (which contains the result of the XOR between the pixel[0] and the pixel[128]);
6) XOR operation allowing the pixel[0] to be reconstructed (data 2);
7) writing the result of the preceding operation to the bin[0] of the projection 1: the written value corresponds to the value of the pixel[0];
8) reading the bin[0] of the projection 1: contains the value of the pixel[0] written in the preceding operation;
9) writing the previously read value to the support memory at the location of pixel[0];
10) resetting the value of the bin that was just read (XOR operation on itself);
11) writing the result to the bin memory (bin of index 0 of the projection1);
12) reading the bin of index 1 of the projection0;
13) XOR operation between the content that was just read and the value of the pixel[0]: the result obtained is the value of the pixel[129];
14) writing the result of the XOR operation to the bin[1] of the projection0

In the case of the implementation of the standard Mojette transform described in the example above, the reconstruction of a pixel involves two XOR operations and two bin rewrites for one projection. In a general manner, there are M bin rewrites for one projection.

Inverse Mojette Transform According to the Invention

In the implementation of the Inverse Mojette transform that is a subject of the invention, the intermediate operations of reading and writing from/to the bin memory are omitted. A reconstruction is thus obtained more quickly by being based on the fact that, except for the one or more direct bins and pixels, the reconstruction of a pixel of the support requires a combination of the bin of a projection and a number of support pixels that have already been reconstructed. This number depends on the defined number M of projections.

Thus, with respect to the preceding example, pixel[128], pixel [0] and pixel[129] may be reconstructed as follows:

pixel[128]=projections[0].bin[0]

pixel[0]=projections[1].bin[0]^pixel[128]

and pixel[129]=projections[0].bin[1]^pixel[0] ]

Specifically, projections[0].bin[0] contains the direct pixel pixel[128] and thus forms the starting point of the reconstruction.

Thus, in the new implementation of the inverse Mojette transform, the reconstruction of a pixel[k] of a support is given by the general form:

$$pixel[k] = projections[i].bin[j] \char`\^ support(l) \char`\^ \ldots \char`\^ support(n);$$

Figure 8:
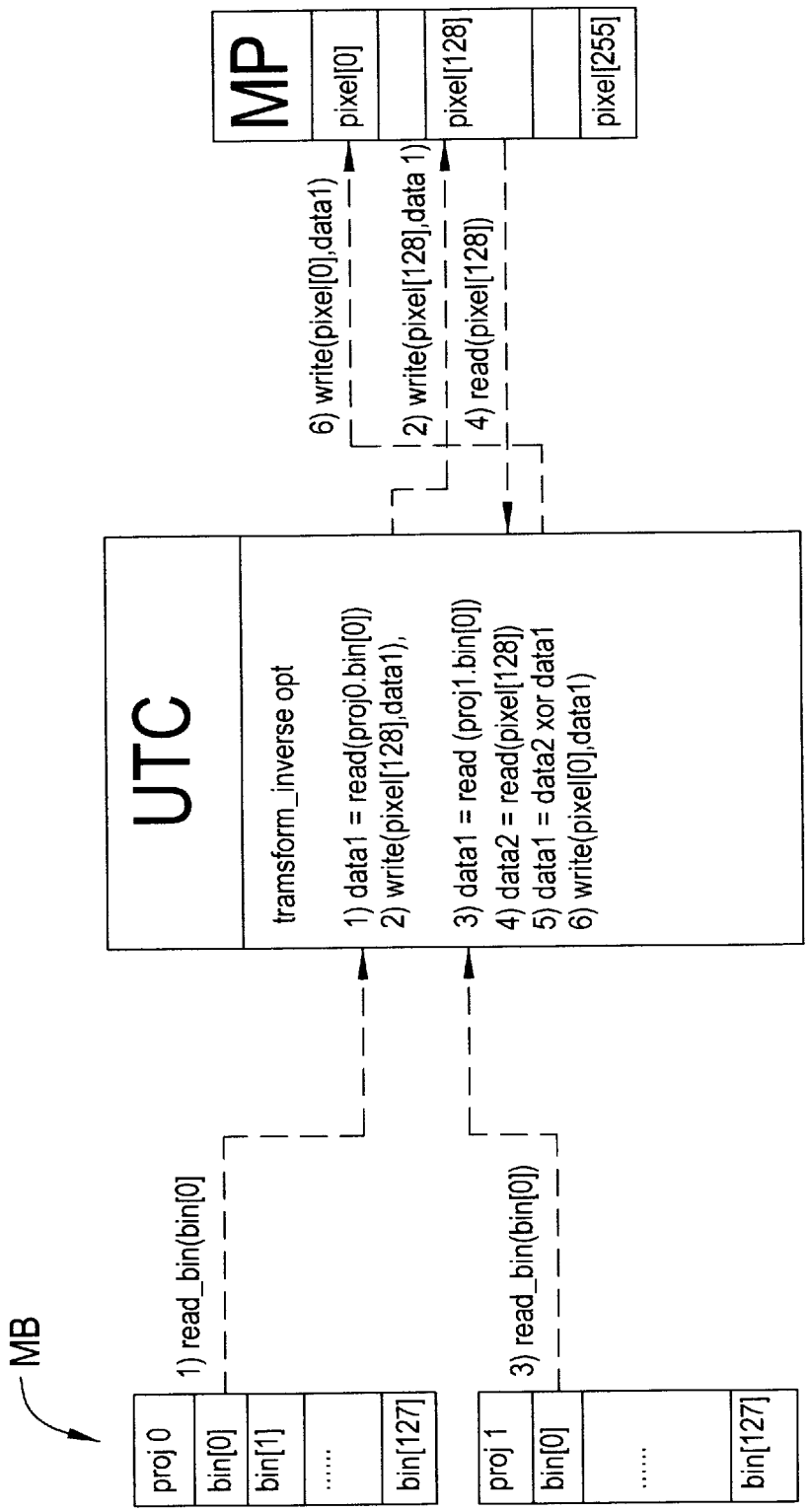
FIG. 8 illustrates the operations carried out for the same example as that of FIGS. 6 and 7 by applying a reconstruction using the inverse Mojette transform according to the invention.

FIG. 8 illustrates the operations carried out for the same example with the new implementation of the inverse Mojette transform that is a subject of the invention:
1) reading the content of the bin[0] of the projection0 that contains the pixel[128] (data1)
2) writing the pixel[128] to the pixel memory
3) reading the bin[0] of the projection1 (contains the result of the XOR operation between the pixel[0] and the pixel [128]);
4) reading the pixel[128] from the pixel memory;
5) XORing the pixel[128] and the content of the bin[0] of the projection1: the result provides the value of the pixel[0];
6) writing the result to the pixel memory at the location of pixel[0].

In order to generate a reconstruction program using the inverse Mojette transform that is a subject of the invention, the unit is configured to execute the pixel reconstruction program using the implementation of the standard inverse Mojette transform, in "offline" mode, i.e. by simulating the steps of writing on the pixel and bin memories.

This execution allows, for each pixel to be reconstructed, the pixels and the bin of the projection involved in its reconstruction to be obtained, or, in the case of a direct relationship, a direct pixel corresponding to a direct bin to be obtained.

From the relationships between pixels and bins identified during said offline execution, the unit generates one or more reconstruction programs, referred to as "online" reconstruction programs, according to which each pixel to be reconstructed, denoted by pixel[k], other than that or those having a direct relationship with a bin, is computed by an equation in the form:

$$pixel[k] = projection[i].bin[j] \char`\^ pixel[i]$$

or $$pixel[k] = projection[i].bin[j] \char`\^ pixel[l] \char`\^ \ldots \char`\^ pixel[n]$$

where:
k, l, n are indices defining the pixels of the support to be reconstructed that are involved in computing projection[i].bin[j];
^: the XOR operator
projection[i].bin[j]: the value of a bin that has been generated by using the pixel [k], and the pixels pixel[l], . . . , pixel[n], in particular the value of the $j^{th}$ bin of projection[i].

Stated otherwise, the or each online reconstruction program is a suite of operations of support[k]=projection[i].bin [j]^support[l]^ . . . ^ support[n] type, obtained via an offline execution of the inverse Mojette transform algorithm according to the implementation known from the prior art, for the set of M projections in question. Advantageously, the M projections used for reconstructing the pixels are arranged in ascending order of their angles (p,q).

The unit may generate as many reconstruction programs as there are possible combinations of projections and, potentially, sizes of configured blocks.

The setup and the method according to the invention may be used for various applications, including applications of scale-out NAS-cloud storage, networking, ad-hoc network and image and video encoding types.

Each memory may be formed from multiple separate memory areas and may be decentralized or not decentralized.

The present invention is in no way limited to the embodiments described and shown, and those skilled in art will be able to provide any variant thereof in accordance with its spirit.

Those skilled in the art easily understand that the various steps and functions of the embodiments presented above may be carried out in the form of computer programs. In particular, the steps described above may be carried out in the form of electronic and/or computer instructions that can be executed by a processor.

These computer programs, or computer instructions, may be contained in program storage devices, e.g. data storage media that can be read by computer, or executable programs. The programs or instructions may also be executed from program storage peripherals.

The present invention is in no way limited to the embodiments described and shown, and those skilled in art will be able to provide any variant thereof in accordance with its spirit.

The invention claimed is:

1. A data processing system, said data processing system being configured to reconstruct a block, referred to as a support, formed from basic computer data, referred to as pixels, using other computer data, referred to as bins, said bins being elements of at least two different projections which result from a mathematical transform of Mojette type applied to said pixels, the data processing system also comprising:
   a processor;
   a bin memory in which said bins are memorized;
   a pixel memory, separate from the bin memory, in which the pixels of said block to be reconstructed are intended to be written;
   wherein said processor is configured to:
   receive a request to reconstruct the block of pixels;
   reconstruct one, or more, pixels of the block, referred to as a direct pixel, whose value is equal to that of a bin, referred to as a direct bin, a computation of said direct bin having involved only said direct pixel;
   reconstruct each remaining pixel by applying a XOR operator between a bin, whose computation has involved said remaining pixel, and the one or more other reconstructed pixels which are involved, with said remaining pixel, in said computation of said bin;
   carry out said reconstruction of the pixels by reading said bins from the bin memory, writing reconstructed pixels to the pixel memory, and by reading said reconstructed pixels from the pixel memory, so that the steps of reconstructing the pixels are without modifying the bin values in the bin memory.

2. The data processing system as claimed in claim 1, wherein the processor comprises a pixel reconstruction program, allowing said reconstructing steps to be carried out, said pixel reconstruction program having instructions according to which each direct pixel to be reconstructed, denoted by support(kd), is computed by an equation in the form:

$$support(kd) = projection[i].bin[j],$$

and said pixel reconstruction program having instructions according to which each pixel to be reconstructed, denoted by support(k), other than a direct pixel, is computed by an equation in the form:

support(k)=projection[i].bin[j]^support(l)

or support(k)=projection[i].bin[j]^support(l)^ . . . ^ support(n)

k or kd being an index of a pixel of the support to be reconstructed;
l, n being indices defining various pixels of the support that have already been reconstructed and which have been used to generate bin projection[i].bin[j];
^: XOR operator;
projection[i].bin[j]: value of bin[j] of projection projection[i] which has been generated by using the support (k) or support (kd) pixel and, when the bin is not a direct bin, the support(l) pixel or support(l) ^ . . . ^A support(n) pixels.

3. The data processing system as claimed in claim 2, wherein the processor comprises an association program comprising, for each pixel to be reconstructed, the following instructions:
   identifying the or each bin in a computation of which said pixel to be reconstructed is involved;
   associating said bin and said pixel in a lookup table;
   and in that said processor is configured to generate said pixel reconstruction program according to the lookup table.

4. The data processing system as claimed in claim 1, wherein, as said data processing system is also configured to generate bins by applying a mathematical transform of Mojette type to a block of pixels, the processor is configured to generate a bin generation program, allowing said bins to be generated, said bin generation program comprising, for each bin to be generated, the following instruction steps:
   reading, from the pixel memory, the pixel or pixels to be combined together in order to generate said bin;
   generating said bin by applying the XOR operator to values of said pixels or generating said bin with a value that is equal to the pixel in the case in which the generation of the bin solely involves said pixel;
   writing the result of the generating step to the bin memory;
   and in that the bin generation program is exempt from instructions to reset a bin value to be generated, from a step of intermediately reading a bin to be generated and from a step of XOR combination of a bin to be generated and said pixels.

5. The data processing system as claimed in claim 4, wherein the processor comprises a bin generation simulation program, including instructions to reset bin values to be generated and/or to intermediately read a bin to be generated and/or to combine a bin to be generated and said pixels,
   and in that the processor is configured to generate said bin generation program after having executed the bin generation simulation program, the processor being configured to generate said bin generation program by identifying one or more pixels used by said bin generation simulation program in order to generate corresponding bins and by defining instructions to combine pixels that are exempt from said instructions to reset a value of a bin to be generated, and/or from a step of intermediately reading a bin to be generated and/or from a step of XOR combination of a bin to be generated and said pixels.

6. A data processing method, said data processing method allowing a block, referred to as a support, to be reconstructed in a pixel memory, which block is formed from basic computer data, referred to as pixels, using other computer data, referred to as bins, said bins being elements of at least two different projections which result from a mathematical transform of Mojette type applied to said pixels and which are memorized in a bin memory, separate from the pixel memory,
   wherein said method comprises the following steps:
   receiving a request to reconstruct the block of pixels;
   reconstructing one, or more, pixels of the block, referred to as a direct pixel, whose value is equal to that of a bin, referred to as a direct bin, a computation of said direct bin having involved only said direct pixel;
   reconstructing each remaining pixel by applying a XOR operator between a bin, whose computation has involved said remaining pixel, and one or more other reconstructed pixels which are involved, with said remaining pixel, in a computation of said bin;
   carrying out said reconstructing steps by reading said bins from the bin memory, reading said reconstructed pixels from the pixel memory, and by writing the reconstructed pixels to the pixel memory, so that the steps of reconstructing the pixels are without modifying the bin values in the bin memory.

7. The data processing method as claimed in claim 6, wherein each direct pixel to be reconstructed, denoted by support(kd), is computed by a pixel reconstruction equation in the form:

support(kd)=projection[i].bin[j], and each pixel to be reconstructed, denoted by support(k), other than a direct pixel, is computed by a pixel reconstruction equation in the form:

support(k)=projection[i].bin[j]^support(l)

or support(k)=projection[i].bin[j]^support(l)^ . . . ^ support(n)

k or kd being an index of a pixel of the support to be reconstructed;
   l, n being indices defining various pixels that have been reconstructed and which have been used to generate bin projection[i].bin[j];
   ^: XOR operator;
   projection[i].bin[j]: a value of bin[j] of projection projection[i] which has been generated by using the support (kd) or support (k) pixel and, when the bin is not a direct bin, the support (l) pixel or support(l) ^ . . . ^ support (n) pixels.

8. The data processing method as claimed in claim 7, wherein, prior to the reception of the reconstruction request, the data processing method comprises the following steps, for each pixel to be reconstructed:
   identifying the or each bin in the computation of which said pixel to be reconstructed is involved;
   associating said bin and said pixel in a lookup table;
   generating said pixel reconstruction equations according to the lookup table.

9. The data processing method as claimed in claim 6, wherein, in order to generate a bin, the method comprises the following steps:
   reading, from the pixel memory, the pixel or pixels to be combined together in order to generate said bin;
   generating said bin by applying the XOR operator to values of said pixels or generating said bin with a value that is equal to the pixel in the case in which the generation of the bin involves a single pixel;

writing the result of said generating step to the bin memory and in that the method for generating said bin is exempt from instructions to reset a value of said bin to be generated, and/or from a step of intermediately reading the bin to be generated and/or from a step of combining a bin to be generated and said pixels.

10. The data processing method as claimed in claim 9, wherein, prior to the generation of bins, a bin generation is simulated which includes instructions to reset the bin values to be generated and/or to intermediately read the bin to be generated and/or to combine a bin to be generated and said pixels, and in that a bin generation program is generated after having simulated the generation of bins, said bin generation program being generated by identifying one or more pixels used in the bin generation simulation in order to generate corresponding bins and by defining instructions to combine pixels that are exempt from said instructions to reset bin values to be generated, and/or from a step of intermediately reading the bin to be generated and/or from a step of combining the bin to be generated and said pixels.

11. A non-transitory computer readable tangible media having instructions stored thereon, that when executed on a processor, cause the processor to carry out the steps of a data processing method as claimed in claim 6.

* * * * *